(12) United States Patent
Morrisroe et al.

(10) Patent No.: US 6,329,757 B1
(45) Date of Patent: Dec. 11, 2001

(54) HIGH FREQUENCY TRANSISTOR OSCILLATOR SYSTEM

(75) Inventors: Peter J. Morrisroe, New Milford; Peter H. Gagne, Brookfield, both of CT (US)

(73) Assignee: The Perkin-Elmer Corporation, Norwalk, CT (US)

( * ) Notice: Subject to any disclaimer, the term of this patent is extended or adjusted under 35 U.S.C. 154(b) by 0 days.

(21) Appl. No.: 08/775,435

(22) Filed: Dec. 31, 1996

(51) Int. Cl.$^7$ .................................................. H01J 7/24
(52) U.S. Cl. .................... 315/111.51; 315/224; 315/223; 219/121.48; 331/176
(58) Field of Search .................... 315/111.51, 111.21, 315/223, 224, 244; 219/121.36, 121.48, 130.4; 331/182, 176

(56) References Cited

U.S. PATENT DOCUMENTS

| | | | |
|---|---|---|---|
| 3,134,947 | * 5/1964 | Charasz | 331/183 X |
| 4,577,165 | 3/1986 | Uehara et al. | 331/109 |
| 4,629,940 | 12/1986 | Gagne et al. | 315/111.51 |
| 4,818,916 | 4/1989 | Morrisroe | 315/111.21 |
| 4,935,596 | * 6/1990 | Gagne | 315/111.51 X |
| 5,334,834 | * 8/1994 | Ito et al. | 315/111.81 X |

FOREIGN PATENT DOCUMENTS

| | | |
|---|---|---|
| 3429574 | 2/1986 | (DE) . |
| 4119738 | 12/1992 | (DE) . |
| 0568920 | 3/1996 | (EP) . |

OTHER PUBLICATIONS

"High Frequency Circuit Design" by James K. Hardy, pp. 246–252 (Prentice Hall 1979).

* cited by examiner

*Primary Examiner*—Haissa Philogene
(74) *Attorney, Agent, or Firm*—St. Onge Steward Johnston & Reens LLC

(57) ABSTRACT

In a high frequency oscillator system a series oscillator circuit includes a load coil inductively coupled with a plasma generator. A capacitance is in series with the coil between the drain and source terminals of a transistor. A capacitive or inductive feedback responsive to the oscillation is connected to the gate terminal of the transistor. In another embodiment two sections of a series circuit are connected by the load coil, each section including a separate transistor. A first capacitance is connected between the coil and the first transistor drain, and a second capacitance is connected between the coil and the second transistor drain. A first capacitive feedback is connected between the second section and the first transistor gate, and a second capactive feedback is connected between the first section and the second transistor gate. For alternative feedback, one feedback is connected between the first section and the first transistor gate, and the other is connected between the second section and the second transistor gate.

42 Claims, 7 Drawing Sheets

HIGH FREQUENCY TRANSISTOR OSCILLATOR SYSTEM

This invention relates to electronic oscillator circuits, particularly to such circuits driven by transistors, and more particularly to such circuits having a loading such as an induction coupled plasma generator.

BACKGROUND

High frequency electronic oscillators, broadly in the range of 10 to 100 MHz, are used for a variety of purposes ranging from radio transmission and reception to heating of materials. A particular application is for the formation of a plasma discharge with an apparatus known as an induction coupled plasma (ICP) generator. Such plasma systems typically are used for spectroscopy, treatment of fine powders, melting of materials, chemical reactions and the like. These applications derive from the high temperatures inherently associated with a plasma, which are high enough to effect electron excitation and ionization of the plasma gas and injected materials. Plasma generation also is utilized to produce ions utilized in instruments for mass spectroscopy and, at low pressure, for vapor deposition processes. Other applications are associated with induction heating of materials, such as graphite of an induction furnace, melting of metals, and the like.

Oscillators must be capable of generating sufficient power for the application, i.e. approximately one kilowatt for ICP. Generally this has been accomplished with circuits incorporating vacuum tubes. Typical tube oscillators in current use with ICP are shown in U.S. Pat. Nos. 4,629,940 and 4,818,916, and copending patent application Ser. No. 08/079,963 filed Jun. 18, 1993 now abandoned and its counterpart European patent application publication No. 0 568 920 A 1, all commonly owned by the present assignee. Other conventional tube oscillators, some of which may not necessarily be suitable for induction heating, are taught in standard texts on the subject. Tube oscillators in common use for ICP tend to be cumbersome, sensitive to tuning problems and limited in efficiency of power transfer (up to about 50%). Tuning problems are associated with requirements for alignment of impedance matching networks, and with the coupling with the ICP and the variable transfer of power thereto. Tubes tend to have changing characteristics with time. Tube circuits also require periodic replacement of tubes, due to finite lifetime of the thermionic emission of the filament electron source.

Oscillators based on transistors have been known for applications such as radio, audio and the like but, to the knowledge of the present inventors, the configurations described herein have not been used for plasma generation. Examples of transistor oscillators are taught in a publication "High Frequency Circuit Design" by J. K. Hardy, 246–252 (Prentice-Hall 1979). These generally deliver low power and use parallel oscillator circuits.

SUMMARY OF THE INVENTION

An object of the present invention is to provide a novel high frequency oscillator system. Another object is to provide such a system utilizing one or more transistors in place of vacuum tubes. A further object is to provide such a transistor system utilizing a series oscillator circuit. Yet another object is to provide such a transistor system having a reduction in problems and complexities associated with tube oscillators. Other objects are to provide such a system capable of delivering relatively high power, and to provide such a system adapted to an induction plasma generator.

The foregoing and other objects are achieved, at least in part, by a high frequency oscillator system formed of a series oscillator circuit comprising an inductance coil, a capacitance means cooperative with the coil to support a high frequency oscillation in the circuit, and a transistor for driving the oscillation. The capacitance means is connected in series with the coil between the drain and source terminals of the transistor. A DC primary voltage is applied between the drain terminal and the source terminal so as to supply electrical power to the transistor means and thereby to the oscillator circuit. A feedback means responsive to the oscillation frequency is connected to the gate terminal to effect a positive feedback for the transistor means to drive the oscillation. The feedback may be capacitive or inductive. In an embodiment with capacitive feedback, the capacitance means comprises a primary capacitance connected in series with the load coil between the drain and an intermediate point connected to the transistor gate terminal, and a secondary capacitance connected between the intermediate point and the source terminal.

In another embodiment a high frequency oscillator system is formed of a series oscillator circuit comprising a first section of circuit, a second section of circuit, and an inductance coil connecting between the first section and the second section. The first section comprises a first capacitance means and a first transistor, and the second section comprises a second capacitance means and a second transistor. The first section, the second section and the coil are operatively connected to support an oscillation in the oscillator circuit. The first transistor has a first source terminal, a first drain terminal and a first gate terminal. The second transistor has a second source terminal, a second drain terminal and a second gate terminal. The first capacitance means comprises a first primary capacitance connected between the coil and the first drain terminal, and the second capacitance means comprising a second primary capacitance connected between the coil and the second drain terminal. A DC primary voltage is applied between the first drain terminal and the first source terminal, and between the second drain terminal and the second source terminal, so as to supply electrical power to each transistor and thereby to the oscillator circuit. A first feedback means responsive to the oscillation is connected to the first gate terminal to effect a positive feedback for the first transistor means to drive the oscillation. A second feedback means responsive to the oscillation is connected to the second gate terminal to effect a positive feedback for the second transistor means to further drive the oscillation.

For capacitive feedback in this system, the first feedback means comprises a first capacitive connection between the second section and the first gate terminal, and the second feedback means comprises a second capacitive connection between the first section and the second gate terminal. For inductive feedback the first feedback means comprises a first inductive connection between the first section and the first gate terminal, and the second feedback means comprises a second inductive connection between the second section and the second gate terminal.

Both single and dual transistor circuits are advantageously applicable to a load means that is inductively receptive of high frequency electrical power for utilization thereof. The inductance coil then is a load coil encompassing the load means so as to inductively couple therewith, whereby electrical power in the oscillation loop is transferred inductively through the load coil to the load means. A particular system is a plasma generating system, wherein the load means comprises a channeling means for channeling a plasma-forming gas within the coil. Electrical power in the oscillation loop is transferred inductively through the load coil to the plasma-forming gas to effect a plasma in the channeling means.

DETAILED DESCRIPTION OF THE PREFERRED EMBODIMENT

Figure 1:
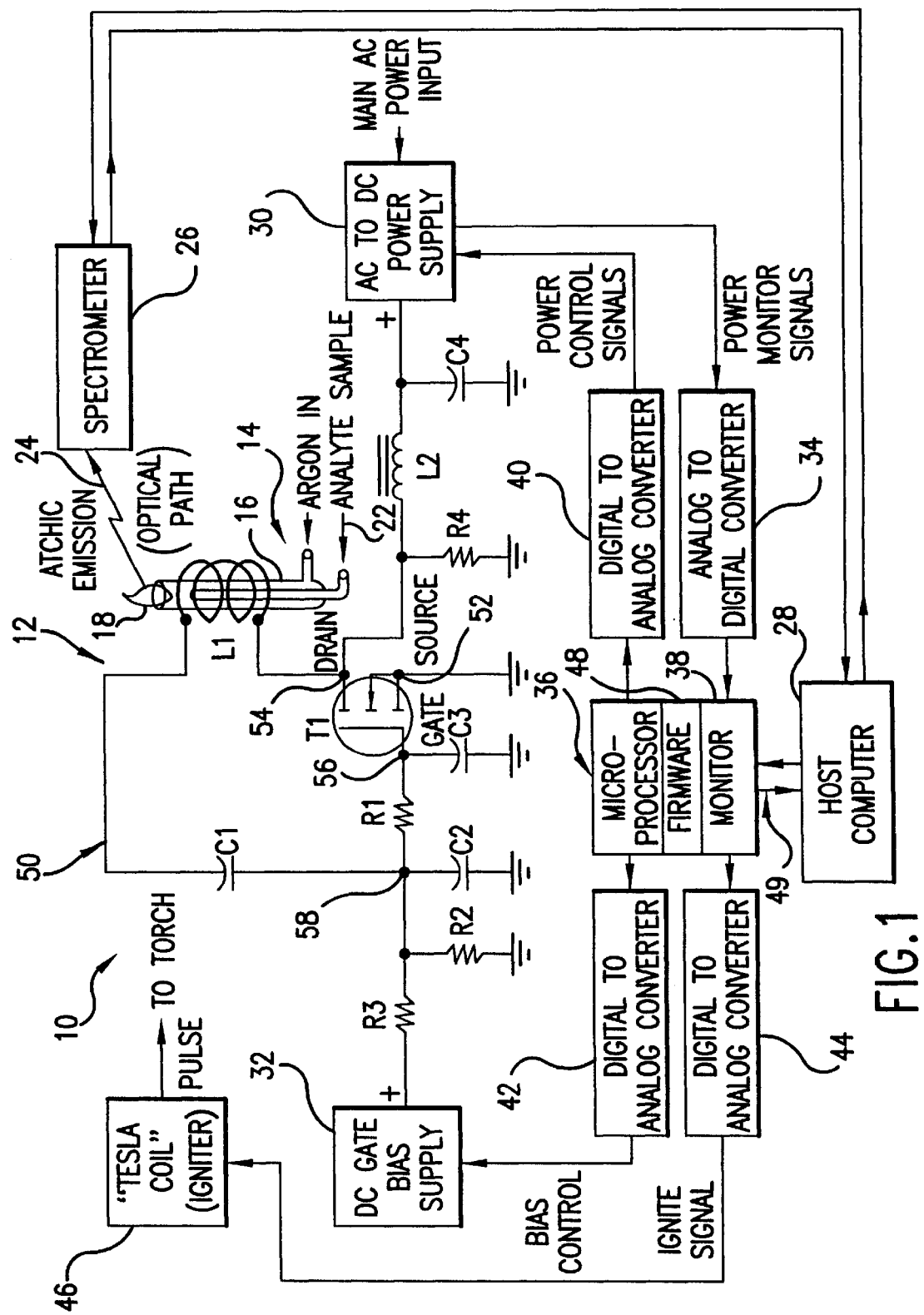
FIG. 1 is a schematic drawing showing basic components utilized with a high frequency oscillator system for generating a plasma according to the invention, with one transistor using capacitive feedback.

FIG. 1 shows a basic arrangement 10 of components incorporating an oscillator circuit 12 of the invention. Although the oscillator may be operated as a free oscillator, generally it is associated with a load that utilizes power from the oscillator. In the present, preferred embodiment, an induction coupled plasma (ICP) generator 14, operating as a plasma torch, includes a means 16 for channeling a plasma-forming gas such as argon. The latter is excited to a hot plasma 18 that constitutes the load on the oscillator by drawing power therefrom. The circuit 12 includes a load coil L1 of about 2 to 3 turns that encompasses the gas channeling to inductively couple the oscillator with the plasma-forming gas. In one application, an analyte sample 22 is injected into the plasma to effect radiation emission 24 which characteristic of the analyte and is directed to an optical spectrometer 26. The latter operates in conjunction with a host computer 28 that controls the spectrometer and analyzes data therefrom. In another application (not depicted), ions of the analyte are drawn from the plasma for analysis in a mass spectrometer. In further applications, the plasma may be replaced with other media or items to be heated, such as graphite of an induction furnace, or metals in an induction heating system. The following descriptions are directed primarily to the embodiment for a plasma generator but should be applicable to other loadings. The oscillators are generally in the range of 10 to 100 MHz, particularly 20–50 MHz, e.g. 27 or 40 MHz.

A DC main power supply 30 provides the primary voltage and power to the oscillator 12 via a transistor T1, and a DC bias supply 32 applies a gate bias voltage to the transistor. Power level delivered by the power supply is monitored, for example in the manner taught in the aforementioned U.S. patent application Ser. No. 08/079,963 filed Jun. 18,1993 and its associated European patent application publication No. 0 568 920 A1, incorporated herein by reference. Signals from the main power supply representing power level are passed through an analog-digital (A/D) converter 34 to a microprocessor 36 dedicated to controlling the oscillator. The microprocessor with its programming includes a monitoring function 38. The monitoring is used particularly for selecting between a startup mode and an operating mode with feedback through a digital-analog (D/A) converter 40 to set the main power supply voltage. The host computer 28 could be used in place of the microprocessor.

The microprocessor also provides feedback through a second D/A converter 42 to set the voltage bias 32. Further feedback is directed through a third D/A converter 44 to a conventional igniter 46. The igniter may be a piezoelectric spark device or a high frequency, high voltage pulse device (e.g. "Tesla coil") for electrically seeding the gas to facilitate initial formation of the plasma. The microprocessor 36 with its dedicated software or firmware programming 48 has a link 49 to the host computer 28 for basic operation of the oscillator for plasma generation.

The host computer 28 may be conventional such as a Digital Equipment Corporation Model 316+ computer incorporated into the spectrometer system by the manufacturer thereof. The computer generally includes a central processing unit with memory sections that may include a disk, a keyboard for operator input, and a monitor and/or a printer. The microprocessor utilized in the present invention is, for example, a Motorola 68332 processor utilized with firmware for the related controls. Programming is conventional such as with "C++" generally incorporated into the host computer by the manufacturer of the computer or DSC. The same programming system may be used for the microprocessor. Programming for the controls will readily be recognized and achieved by those skilled in the art.

In one aspect of the invention (FIG. 1), the oscillator 12 is formed of a series circuit 50 that includes the transistor T1 in series with the load coil L1. The plasma (or other) load 18 acts as coupling inductance and a resistance. The circuit 50 is formed of further components including a capacitance means C1, C2 cooperative with the load coil L1 to support a high frequency oscillation in the circuit, with the transistor T1 driving the oscillation. The capacitance means comprises a primary capacitance C1 and a secondary capacitance C2. The transistor has a source terminal 52, a drain terminal 54 and a gate terminal 56. The capacitance and the load coil are connected in series between the drain terminal and the source terminal. The transistor has an effective capacitance C3 to ground. An example of a suitable transistor is a Motorola MRF-157.

The primary voltage supply 30 is connected to apply a positive DC primary voltage to the drain terminal 54 relative to the source terminal 52 so as to supply electrical power to the oscillator circuit. The bias voltage supply 32 is connected to apply a DC bias voltage between the gate terminal and the source terminal, through a voltage divider of resistors R3, R2 via a line resistance R1. The bias generally is positive, although the gate may be operated with zero voltage in some circumstances; thus a bias supply may not be needed. The DC primary voltage is applied through a conventional AC filter formed of a bypass capacitor C4 to ground and a choke coil L2 connected to the drain. Preferably the source terminal is grounded, and connections to this terminal generally are by way of ground leads.

A feedback means responsive to the oscillation frequency is connected to the gate terminal to effect a positive feedback for the transistor to drive the oscillation. The feedback in this embodiment is capacitive. To effect feedback, the capacitance means is arranged as a voltage divider formed of the primary capacitance C1 connected between the load coil L1 and an intermediate point 58, and the secondary capacitance C2 connected between the intermediate point and the source terminal 52. The feedback is provided through a feedback resistance R1 connected between the intermediate point and the gate terminal 56. The value of this resistance is adjusted for maximum power transferred into the plasma discharge, recognizing an R-C time delay where C is the transistor's internal junction capacitance represented by C3. With such a circuit, electrical power is developed in the oscillator circuit 50 and transferred inductively through the load coil L1 to the plasma-forming gas to effect the plasma 18 in the channeling 16. Examples of component values are C1=50pf, C2=9OOOpf, R2=R3=270 ohms.

It may be desirable for the plasma (or other load) to have an average voltage at least approximately equal to the ground potential. This may be achieved in a revised circuit (FIG. 2), wherein the primary capacitance comprises an intermediate capacitor C1a connected between the load coil L1 and the intermediate point 58, and a drain capacitor C1b, equal in value to the that of intermediate capacitor, connected between the load coil and the drain terminal 54. The total capacitance of these two capacitors is the same as the single primary capacitance C1 of FIG. 1. Other components, connections and functions are essentially the same as for the circuit of FIG. 2 with the same numeral designations. These include the secondary capacitance C2 being connected between the intermediate point and the source terminal, and the feedback resistance R1 connected between the intermediate point and the gate terminal. The source terminal is preferably grounded.

Figure 3:
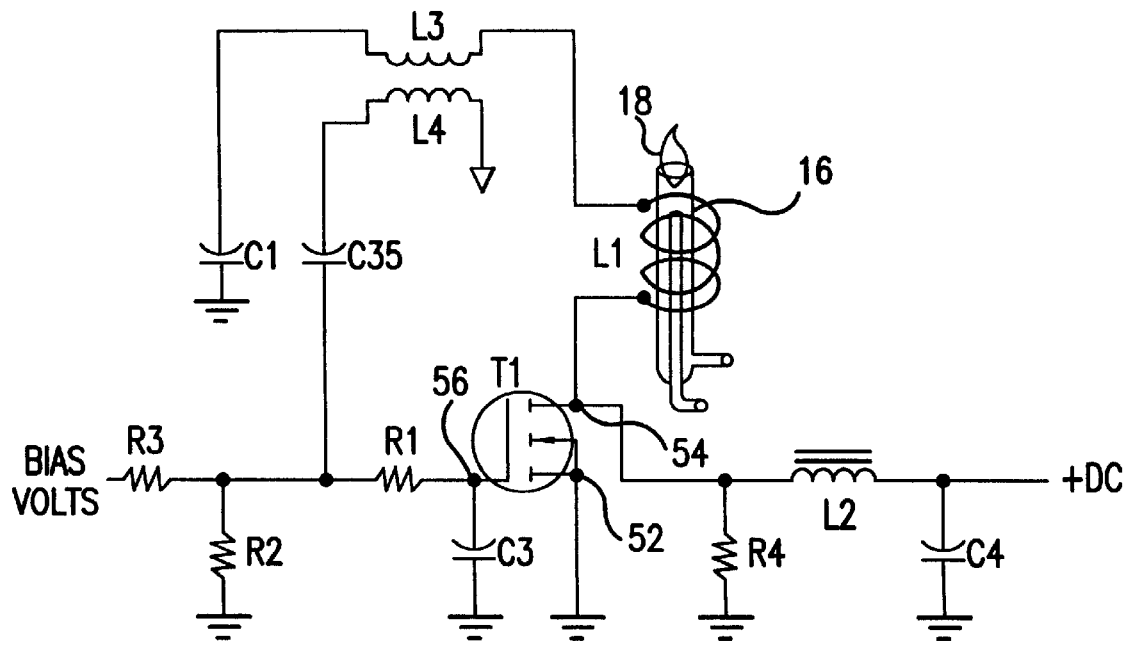
FIG. 3 is a circuit diagram of another embodiment of a high frequency oscillator system for generating a plasma according to the invention, with one transistor using inductive feedback.

The feedback alternatively may be inductive, as shown in FIG. 3, where a transformer with a primary winding L3 and a secondary winding L4 replaces the source capacitance of the previous embodiments. The primary is in the series circuit. The secondary connects through a DC blocking capacitor C35 and the resistor to the transistor gate 56. Other components are the same as for the circuit of FIG. 1 and have the same numeral designations.

In a case such as with a plasma load, the system should have a startup mode and an operating mode because of the different impedances associated with the ordinary plasma-forming gas and the plasma form. To do this the primary voltage supply momentarily applies a starting primary voltage for the startup mode, and an operating primary voltage lower than the starting primary voltage for the operating mode. Also, the bias voltage supply applies a starting bias voltage for the startup mode, and an operating bias voltage lower than the starting bias voltage for the operating mode. The startup mode is effected with seeding of the plasma as indicated above. Although not shown, a relay with additional capacitors for startup may be used as described below with respect to FIG. 4A.

In further embodiments of the invention, the oscillator circuit has two synchronized, balanced transistor sections connected in series. As in the foregoing simpler circuits, such a high frequency oscillator system 60, for example with capacitive feedback (FIG. 4A), is applied advantageously to a loading such as a channeled plasma that is inductively receptive of high frequency electrical power in the same manner as set forth above. A load coil L41 encompasses the plasma load 62 so as to inductively couple therewith in the same manner as illustrated in FIG. 1. In the present case the plasma load is illustrated as an effective resistance R40 in a series loop with a secondary inductance L40 which is coupled to the "primary" load coil L41.

A series oscillator circuit 64 comprises a first section 66 of circuit, a second section 68 of circuit, and the load coil L41 which connects between the first section and the second section. The first section is formed of a first capacitance means in series with a first transistor T41. Similarly, the second section is formed of a second capacitance means in series with a second transistor T42. The first section, the second section and the load coil are operatively connected to support an oscillation in the full circuit.

The first transistor T41 has a first source terminal 70, a first drain terminal 71 and a first gate terminal 72. The second transistor T42 has a second source terminal 73, a second drain terminal 74 and a second gate terminal 75. In this embodiment, the first capacitance means comprises a first primary capacitance C40 connected between a first terminal 88 of the load coil L41 and the first drain terminal 71, and the second capacitance means comprises a second primary capacitance C41 connected between a second terminal 90 of the load coil and the second drain terminal 74. The source terminals are grounded, and connections thereto are generally through ground.

A primary voltage means P41 is connected to apply DC primary voltage between the first drain terminal 71 and the first source terminal 70 via a filter formed of a first bypass capacitance C42a, C42b and a first choke coil L42A. (It should be recognized that each capacitance indicated herein may be formed of two or more capacitors in series or, for the present cases, parallel.) The voltage (advantageously from the same source P41) also is applied between the second drain terminal 74 and the second source terminal 73 via a further filter formed of a second bypass capacitance C42c, C42d and a second choke coil L42B. Electrical power is thus supplied to each transistor and thereby to the oscillator circuit. A bias voltage supply P42 applies a positive DC bias between the first gate terminal 72 and the first source terminal 70 through a first pair of voltage divider resistors R43, R41, and between the second gate terminal 75 and the second source terminal 73 through a second pair of voltage divider resistors R44, R42. A further pair of bypass capacitors C50a, C50b is connected across the bias voltage.

Figure 2:
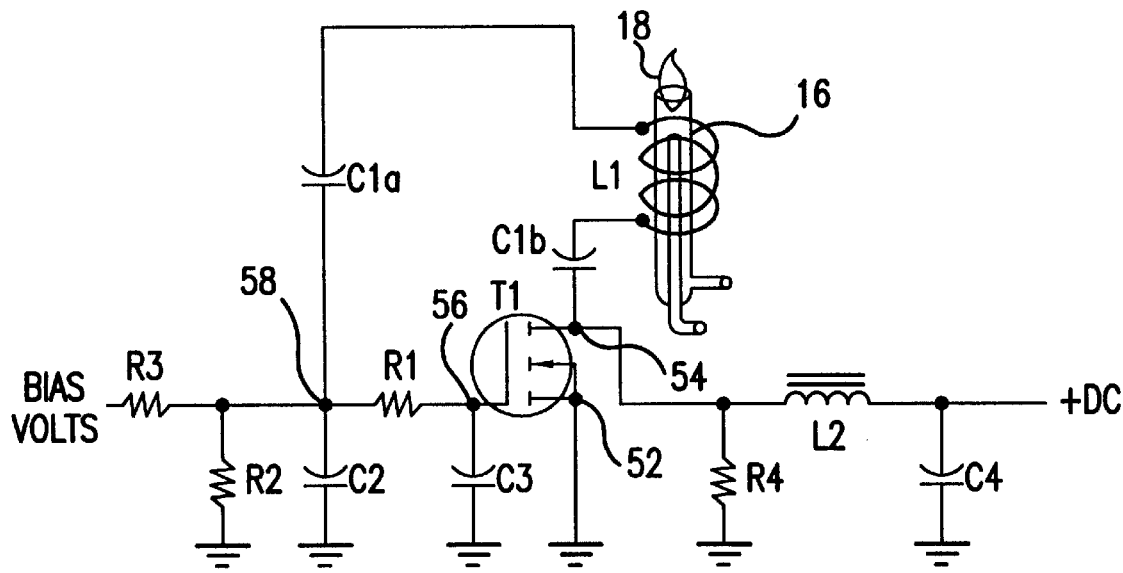
FIG. 2 is a circuit diagram of another embodiment of a high frequency oscillator system for generating a plasma according to the invention, with one transistor using capacitive feedback.

Optionally (not shown) the first and second transistors T41, T42 each may consist of two or more component transistors with corresponding source terminals, drain terminals and gate terminals connected in parallel to respectively form (for the first) the first source terminal, the first drain terminal and the first gate terminal, and (for the second) the second source terminal, the second drain terminal and the second gate terminal. This may be desirable where a single transistor of suitable power rating may not be available, and also may be done in simple oscillator circuits (FIGS. 1–3).

Figure 4A:
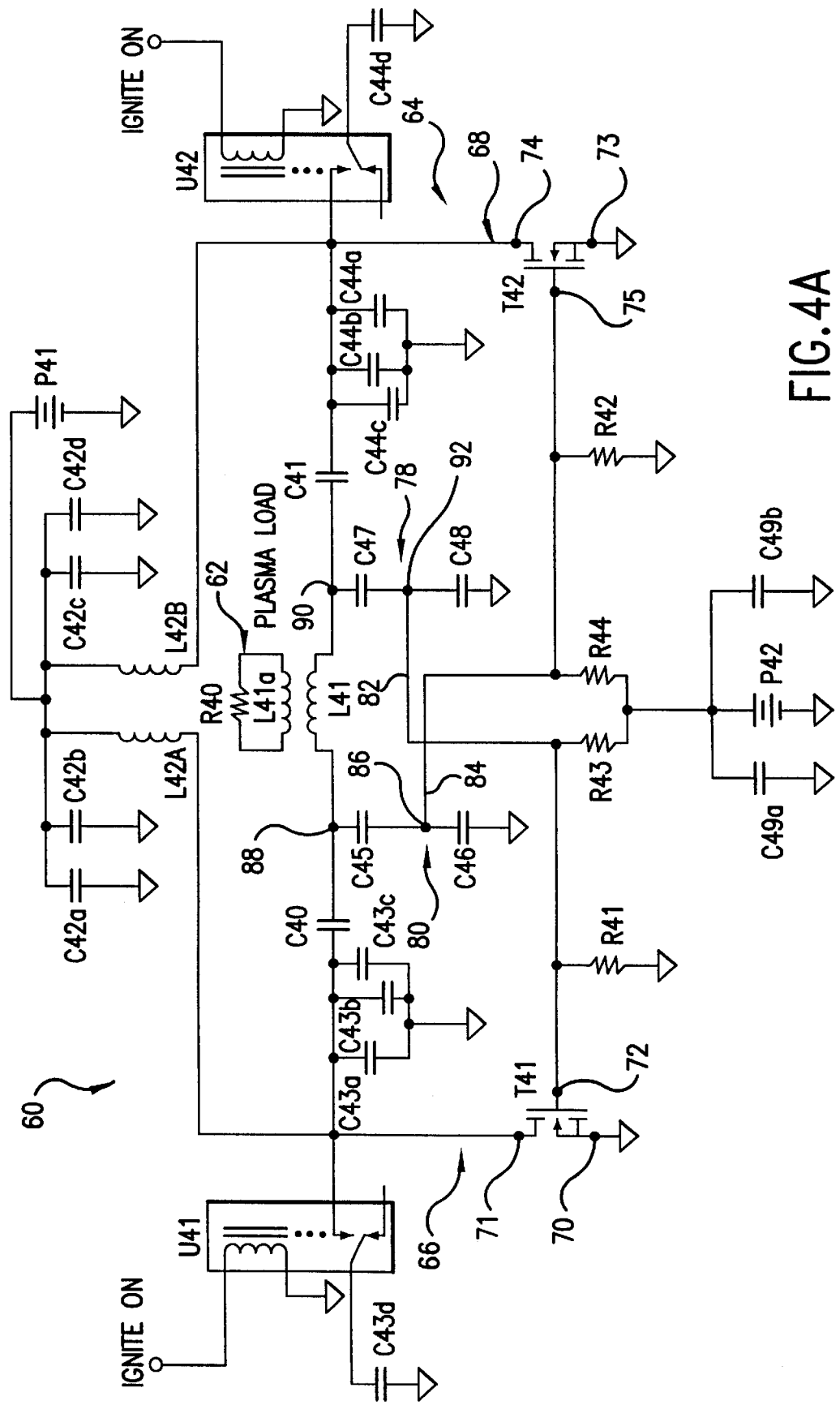
FIG. 4A is a circuit diagram of another embodiment of a high frequency oscillator system for generating a plasma according to the invention, with two transistor sections of a circuit using capacitive feedback.

In the embodiment of FIG. 4A, a first transistor capacitance formed of capacitors C43a, C43b, C43c is connected between the first drain terminal 71 and the first source terminal 70 (through ground), and a second transistor capacitance formed of capacitors C44a, C44b, C44c is connected between the second drain terminal 74 and the second source terminal 73. Each of these transistor capacitors has a substantially higher capacitance than that of each corresponding primary capacitances C40, C41, to resonate the load coil L41, in a form of impedance matching which increases the voltage across the coil to a level much greater than the supply voltage.

A first feedback means 78 responsive to the oscillation is connected to the first gate terminal 72 to effect a positive feedback for the first transistor T41 to help drive the oscillation. Similarly, a second feedback means 80 responsive to the oscillation is connected to the second gate terminal 75 to effect a positive feedback for the second transistor T42 to further drive the oscillation. Broadly, the feedback may be inductive or capacitive. For proper phasing in capacitive feedback, the first feedback means should comprise a first capacitive connection 82 between the second circuit section 68 and the first gate terminal 72, and the second feedback means should comprise a second capacitive connection 84 between the first circuit section 66 and the second gate terminal 75.

In the embodiment of FIG. 4A, for the first feedback means, a first intermediate capacitor C47 is connected between a first intermediate point 92 and a second coil terminal 90 of the load coil L41, and a first source capacitor C48 is connected between the first intermediate point 92 and the second source terminal 73 (via ground). The first intermediate point 92 is cross connected 82 to the first gate terminal 72. Similarly, for the second feedback means, a second intermediate capacitor C45 is connected between the first load coil terminal 88 and a second intermediate point 86, and a second source capacitor C46 is connected between the second intermediate point 86 and the first source terminal 70. The second intermediate point 86 is cross connected 84 to the second gate terminal 75.

The first section and the second section of the circuit should have matched topologies, i.e. substantially identical components and circuit board arrangements. With both source terminals connected to ground potential, the load such as the plasma will have an average voltage substantially equal to the ground potential. The matched topologies place equal but opposite potentials at each end of the load coil, thereby creating zero potential at the center of the coil. As in previous embodiments, connections to the transistor source terminals are generally by way of ground connections.

As for the simpler circuits, with a plasma load or the like where there are different impedances associated with the ordinary plasma-forming gas and the plasma form, the system should have a startup mode and an operating mode. These are effected with different voltage levels along with electrical seeding, preferably with a monitoring means for power level, in the manner described above with respect to the single transistor circuit.

Figure 4B:
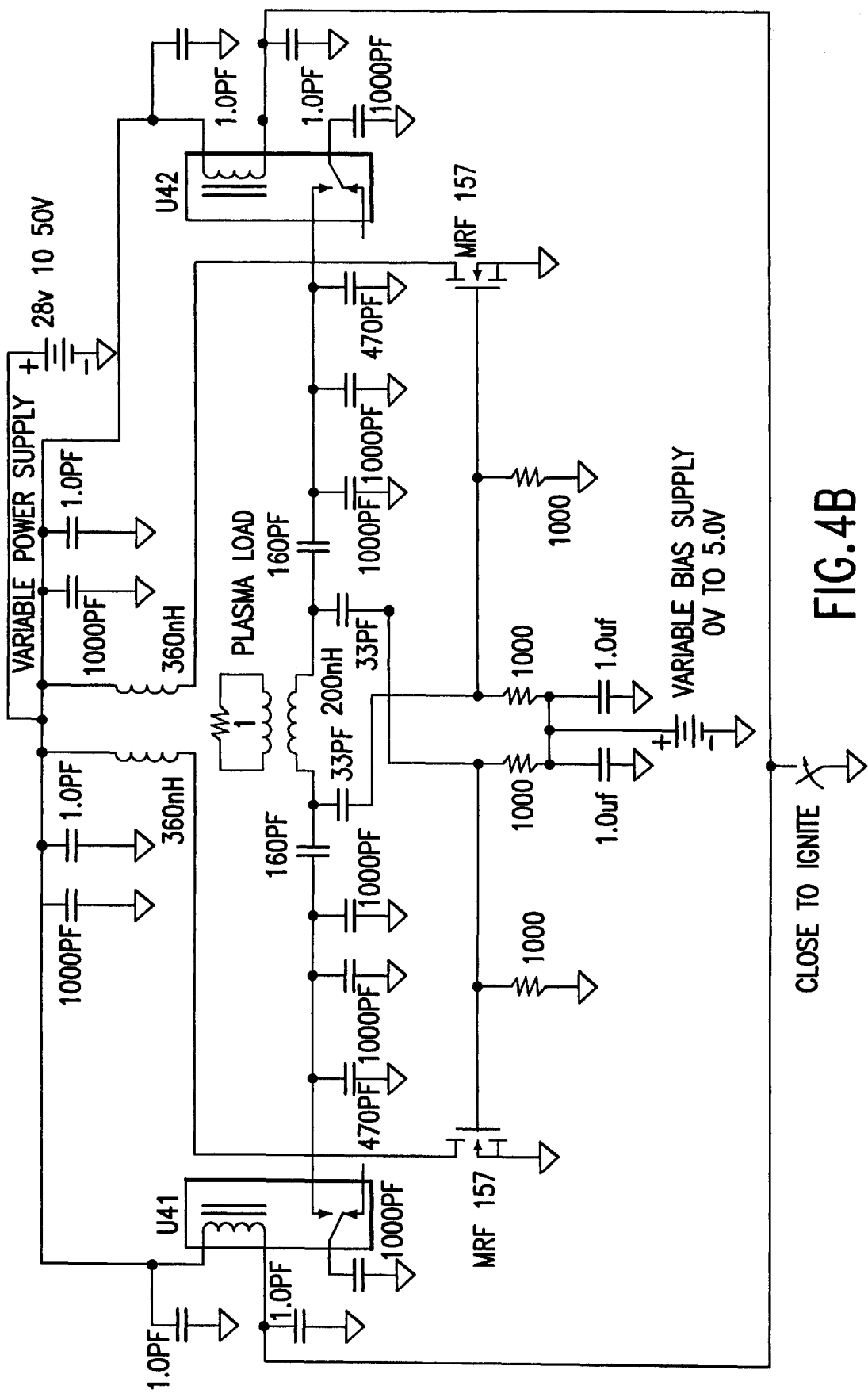
FIG. 4B shows example values for components in the circuit of FIG. 4A.

It also may be desirable to modify the oscillator during startup, so as to further enhance formation of the plasma. In a preferred embodiment (FIG. 4A), a first solenoid relay switch U41 is connected to the first drain terminal 71, and a first shunt capacitor C43d is connected between the first switch and the first source terminal 70. Similarly, a second relay switch U42 is connected to the second drain terminal 74, and a second shunt capacitor C44d is connected between the second switch and the second source terminal 73. In response to the monitor 38 (FIG. 1), the switches are closed the startup mode, and opened during the operating mode. Switching in these capacitors modifies the effect of the transistor capacitors C43a–c, C44a–c, by changing the impedance matching so as to develop higher voltages during ignition. Electronic switching devices such as solid state switches may be used in place of solenoids. FIG. 4B shows example values for components in the circuit of FIG. 4A. The physical embodiment of C46 and C48 is the internal gate capacitance of T41 and T42.

Figure 5A:
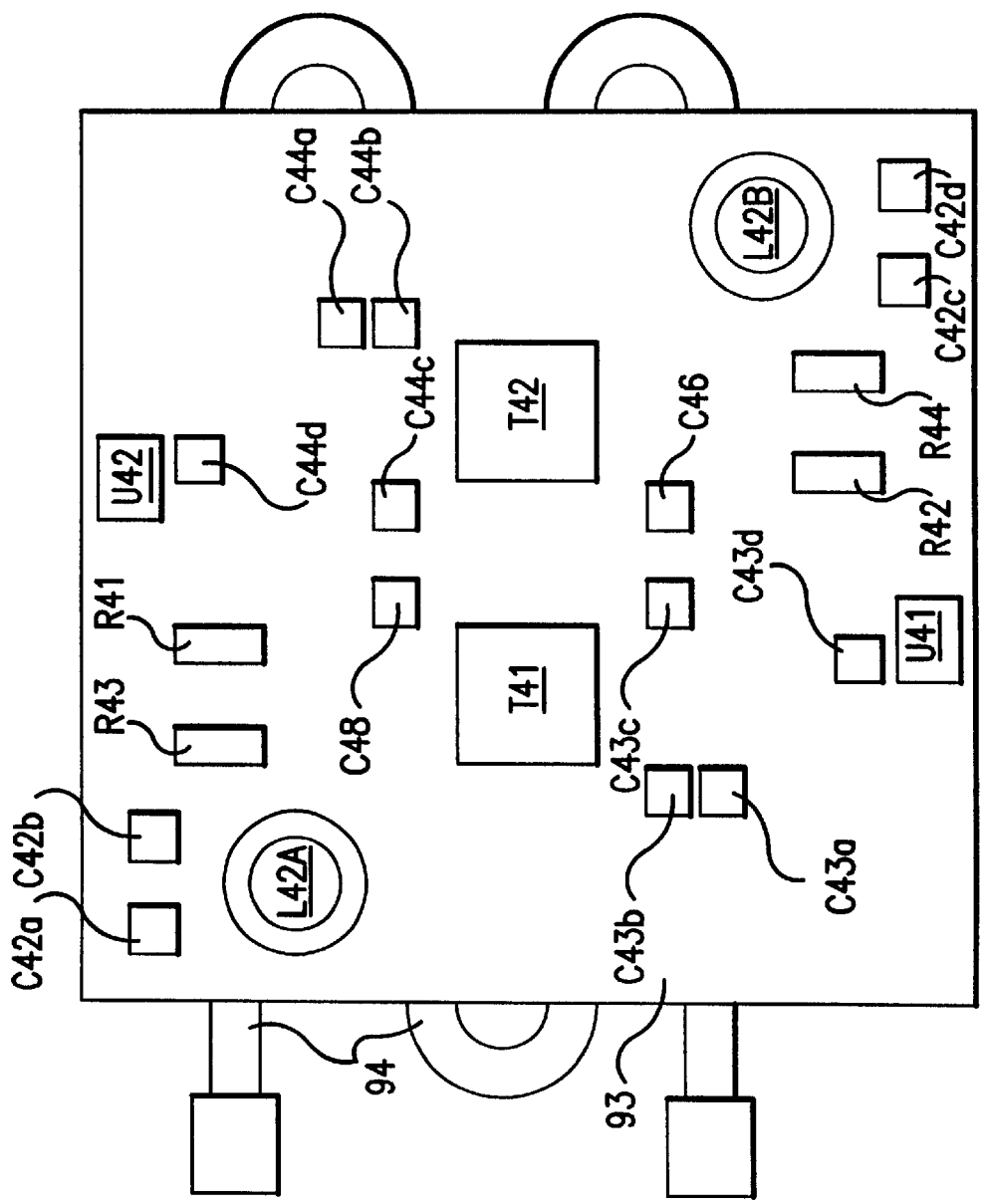
FIG. 5A is a component placement drawing of a circuit board showing some components of the circuit of FIG. 4A
Figure 5B:
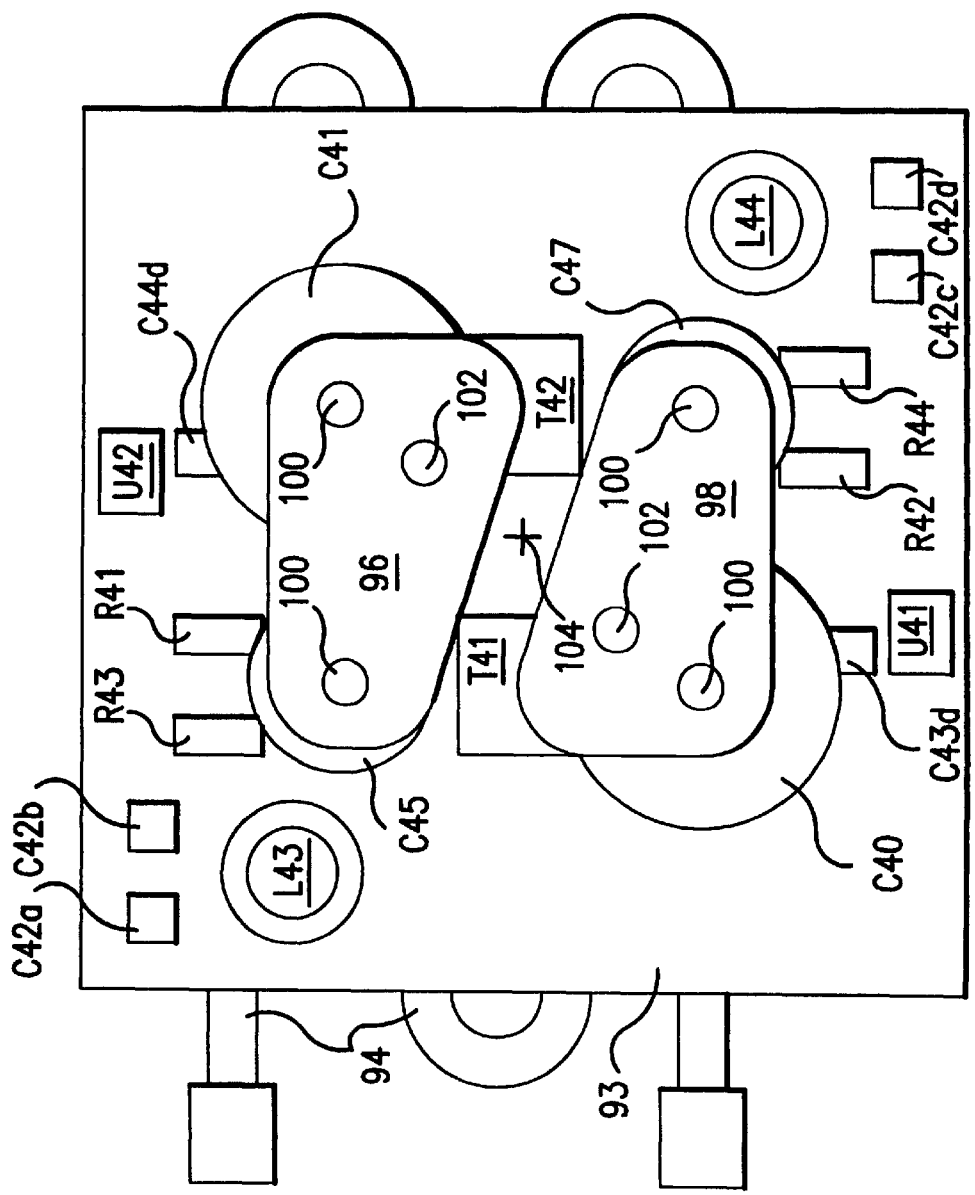
FIG. 5B is a component placement drawing of the circuit board of FIG. 5A showing additional components of the circuit of FIG. 4A.

An example of a layout on a circuit board 93 for the circuit of FIGS. 4A-B is shown in FIG. 5A (with the larger capacitances removed for view) and FIG. 5B (with these capacitances shown). Conductive strips and solder connections (not shown) between components are conventional. The board is mounted on a water cooled block (not visible) which has water piping 94 passing through. A conducting plate 96 (e.g. copper or brass) is attached physically and electrically by screws 100 to the tops of the capacitors C41, C45. Another plate 96 is attached similarly to the capacitors C40, C47. A threaded hole 102 in each block is receptive of a respective end of the load coil L41 which has an axis 104 perpendicular to the drawing. The chokes L43, L44 are formed on toroidal rings of iron powder, with about six windings (not shown) on each.

Figure 6:
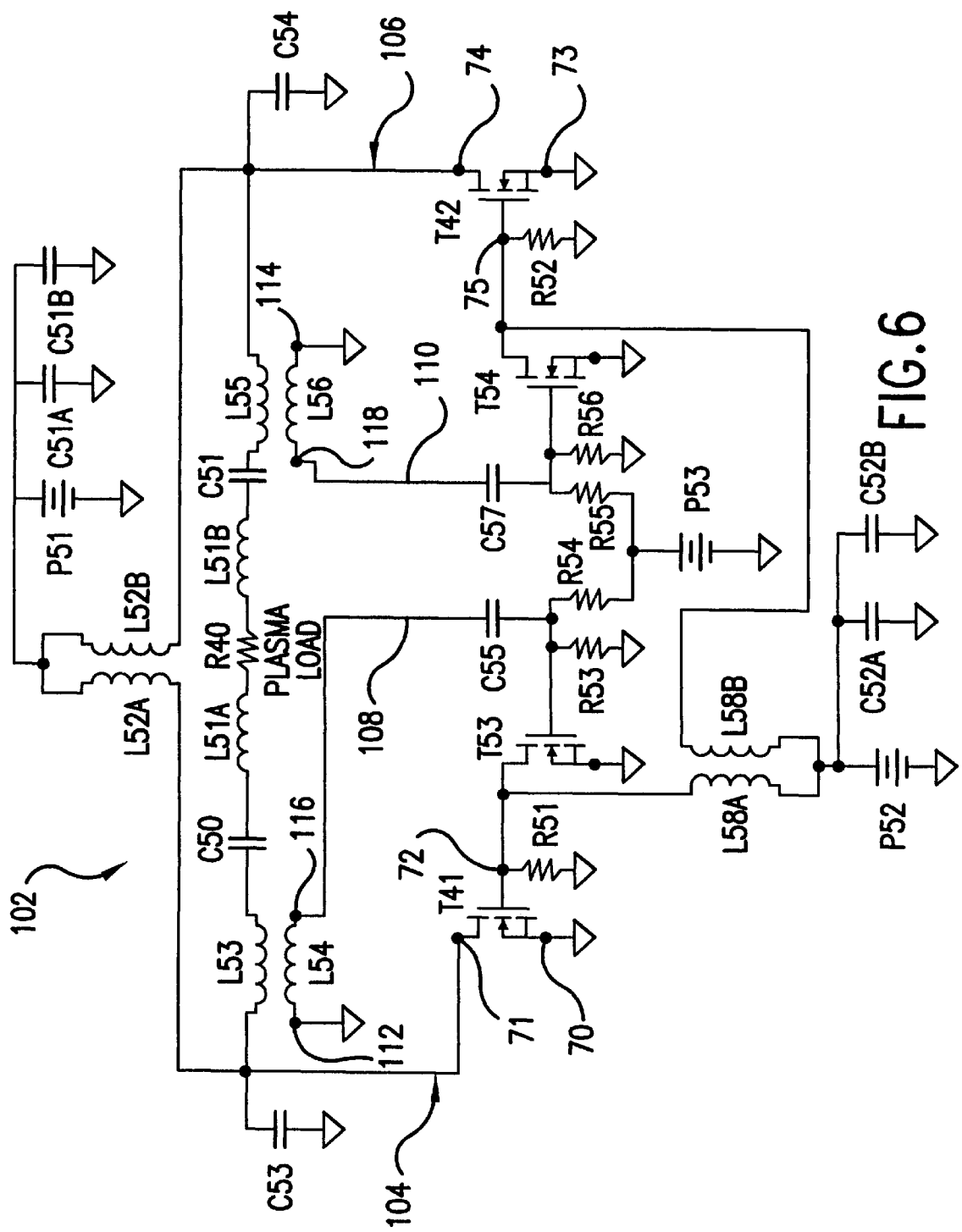
FIG. 6 is a circuit diagram of another embodiment of a high frequency oscillator system for generating a plasma according to the invention, with two transistor sections of a circuit using inductive feedback.

A synchronized balanced circuit with inductive feedback is illustrated in FIG. 6. An oscillator circuit 102 includes a first section 104, a second section 106 and a load coil. The load coil is depicted in two parts L51A, L51B separated by the effective resistance R40 of the plasma load. The coil parts also include the effective inductance of the load. (The actual configuration of the load coil and plasma is the same as in the foregoing embodiments, and merely depicted differently in this figure.) The first circuit section 104 includes a first primary capacitor C50 and a first transistor T41 with a first transistor capacitor C53 to ground. The second circuit section 106 includes a second primary capacitor C51 and a second transistor T42 with a second transistor capacitor C54 to ground. The respective transistor source terminals 70, 73 and connections thereto are grounded. A primary voltage supply P51 is connected to the respective drain terminals 71, 74 via chokes L51A, L51B and parallel bypass capacitors C51A, C51B. A gate voltage supply P52 is connected to the respective transistor gate terminals 72, 75 via filters formed of additional chokes L58A, L58B and parallel bypass capacitors C52A, C52B. The gates have respective bias voltage resistors R51, R52 to load the transistors.

The inductive feedback connections 108, 110 are applied directly within each section as there is direct phasing in this case. A first transformer has a first primary winding L53 connected between the first primary capacitance C50 and the first drain terminal 71, and a second transformer has a second primary winding L55 connected between the second primary capacitance C51 and the second drain terminal 74. One side 112, 114 of each of the secondary windings of the transformers is connected to a respective source terminal 70, 73 via ground. The other, feedback side 116 of the first secondary winding is directed to the first gate terminal 72 through a first input capacitor C55. The feedback side 118 of the second secondary winding is directed to the source terminal 75 through a second input capacitor C57.

With a suitable transformer ratio (e.g. 4:1 primary:secondary) to provide sufficient feedback voltage, the input capacitors C55, C57 could be connected directly to the respective gate terminals. Preferably, a lesser ratio (e.g. 1:1) is used, and the loosely coupled feedbacks are amplified conventionally with respective high frequency amplifiers. These may be in the form of amplifying transistors T53, T54 utilizing for drain voltage the same source P52 used for biasing the gates of the oscillator transistors T41, T42. A dedicated bias voltage P53 is applied to the respective amplifier gates through respective pairs of voltage dividing resistors R54, R53 and R55, R56. The input capacitors C55, C57 block DC from the secondaries L54, L56 of the feedback transformers. The amplifying transistors may be the of same type as the oscillator transistors, or lower power driver transistors.

The foregoing embodiments of series transistor oscillator circuits are relatively simple and have high efficiency (estimated about 85%), longevity, and ease of operation with no special tuning of impedance matching networks. Transistor gain does not drift or change over the lifetime of the devices, so that the input/output efficiency remains constant.

While the invention has been described above in detail with reference to specific embodiments, various changes and modifications which fall within the spirit of the invention and scope of the claims will become apparent to those skilled in this art. Therefore, the invention is intended only to be limited by the appended claims or their equivalents.

What is claimed is:

1. A high frequency oscillator system comprising:
   an oscillator circuit comprising an inductance coil, capacitance means cooperative with the coil to support a high frequency oscillation in the circuit, and transistor means for driving the oscillation, the transistor means having a source terminal, a drain terminal and a gate terminal, and the capacitance means being connected in series with the coil between the drain terminal and the source terminal;
   primary voltage means connected to apply DC primary voltage between the drain terminal and the source terminal so as to supply electrical power to the transistor means and thereby to the oscillator circuit; and
   feedback means responsive to oscillation frequency and connected to the gate terminal to effect a positive feedback for the transistor means to drive the oscillation.

2. The system of claim 1 further comprising load means inductively coupled with the coil such that electrical power in the oscillation loop is transferred inductively through the coil to the load means.

3. The system of claim 2 further comprising bias voltage means for applying a DC bias voltage between the gate terminal and the source terminal.

4. The system of claim 2 wherein the feedback means is responsive to the oscillation frequency inductively.

5. The system of claim 2 wherein the feedback means is responsive to the oscillation frequency capacitively.

6. The system of claim 5 wherein the capacitance means comprises a primary capacitance connected in series with the coil between the drain and an intermediate point, and a secondary capacitance connected between the intermediate point and the source terminal, and the feedback means comprises a connection between the intermediate point and the gate terminal.

7. The system of claim 6 wherein the primary capacitance comprises an intermediate capacitor connected between the coil and the intermediate point, a drain capacitor connected between the coil and the drain terminal, the drain capacitor being equal in value to the that of intermediate capacitor.

8. The system of claim 2 in the form of a plasma generating system, wherein the load means comprises channeling means for channeling a plasma-forming gas within the coil, whereby electrical power in the oscillation loop is transferred inductively through the coil to the plasma-forming gas to effect a plasma in the channeling means.

9. The system of claim 8 further comprising bias voltage means for applying a DC bias voltage between the gate terminal and the source terminal, wherein the system has a startup mode and an operating mode, the primary voltage means comprises means for momentarily applying a starting primary voltage for the startup mode to facilitate formation of the plasma, and an operating primary voltage lower than the starting primary voltage for the operating mode with the plasma, and the bias voltage means comprises means for applying a starting bias voltage for the startup mode, and an operating bias voltage lower than the starting bias voltage for the operating mode.

10. The system of claim 9 further comprising monitoring means connected for monitoring operating power of the primary voltage means, and control means operatively connected to the monitoring means so as to be responsive to the operating power level, and operatively connected to the primary voltage means and the bias voltage means to switch from the startup mode to the operating mode when the operating power reaches a preselected level during the startup mode.

11. The system of claim 9 wherein the system further comprises seeding means for electrically seeding the plasma-forming gas during the startup mode to further facilitate formation of the plasma.

12. The system of claim 9 further comprising modifying means connected to modify the capacitive means during the startup mode to further facilitate formation of the plasma.

13. The system of claim 12 wherein the modifying means comprises a switch connected to the drain terminal, and a shunt capacitor connected between the switch and the source terminal, wherein the switch is closed to connect the source capacitor to the drain terminal during the startup mode, and opened during the operating mode.

14. The system of claim 9 further comprising:
   monitoring means connected for monitoring operating power of the primary voltage means, and control means operatively connected to the monitoring means so as to be responsive to the operating power level, and operatively connected to the primary voltage means and the bias voltage means to switch from the startup mode to the operating mode when the operating power reaches a preselected level during the startup mode;
   modifying means connected to modify the capacitive means during the startup mode to further facilitate formation of the plasma, the modifying means comprising a switch connected to the drain terminal, and a source capacitor connected between the switch and the source terminal, wherein the switch is closed to connect the source capacitor to the drain terminal during the startup mode, and opened during the operating mode; and
   seeding means for electrically seeding the plasma-forming gas during the startup mode to further facilitate formation of the plasma.

15. A high frequency oscillator system comprising an oscillator circuit, the circuit being formed of a first section of circuit, a second section of circuit, and an inductance coil connecting between the first section and the second section, the first section comprising first capacitance means and first transistor means, the second section comprising second capacitance means and second transistor means, the first and second capacitance means being cooperative with the coil to support a high frequency oscillation in the circuit, and the first and second transistor means being operatively connected in the circuit to drive the oscillation.

16. The system of claim 15 further comprising first feedback means responsive to the oscillation and connected to the first transistor to effect a positive feedback for the first transistor means to drive the oscillation, second feedback means responsive to the oscillation and connected to the second transistor to effect a positive feedback for the second transistor means to further drive the oscillation, and primary voltage means connected to apply DC primary voltage between the first drain terminal and the first source terminal, and between the second drain terminal and the second source terminal, so as to supply electrical power to each transistor means and thereby to the oscillator circuit.

17. The system of claim 16 wherein the first transistor means has a first source terminal, a first drain terminal and a first gate terminal, the second transistor means has a second source terminal, a second drain terminal and a second gate terminal, the first capacitance means comprising a first primary capacitance connected between the coil and the first drain terminal, the second capacitance means comprising a second primary capacitance connected between the coil and the second drain terminal, the first feedback means is connected to the first gate terminal, and the second feedback means is connected to the second gate terminal.

18. The system of claim 17 further comprising load means inductively coupled with the coil such that electrical power in the oscillation loop is transferred inductively through the coil to the load means.

19. The system of claim 18 wherein the first section and the second section have matched topologies, the first feedback means and the second feedback means have matched topologies, and the resonance circuit has a connection to ground potential such that the load means has an average voltage substantially equal to the ground potential.

20. The system of claim 19 wherein each source terminal is connected to ground potential.

21. The system of claim 19 further comprising bias voltage means for applying a DC bias voltage between the first gate terminal and the first source terminal, and between the second gate terminal and the second source terminal.

22. The system of claim 19 further comprising a first transistor capacitor connected between the first drain terminal and the first source terminal, and a second transistor capacitor connected between the second drain terminal and the second source terminal.

23. The system of claim 18 in the form of a plasma generating system, wherein the load means comprises channeling means for channeling a plasma-forming gas within the coil, whereby electrical power in the oscillation loop is transferred inductively through the coil to the plasma-forming gas to effect a plasma in the channeling means.

24. The system of claim 23 further comprising bias voltage means for applying a DC bias voltage between the first gate terminal and the first source terminal, and between the second gate terminal and the second source terminal, wherein the system has a startup mode and an operating mode, the primary voltage means comprises means for momentarily applying a starting primary voltage for the startup mode, and an operating primary voltage lower than the starting primary voltage for the operating mode, and the bias voltage means comprises means for applying a starting bias voltage for the startup mode, and an operating bias voltage lower than the starting bias voltage for the operating mode.

25. The system of claim 24 further comprising monitoring means for monitoring the primary voltage means for operating power level, and control means responsive to the operating power level and operatively connected to the primary voltage means and the bias voltage means to switch from the startup mode to the operating mode when the operating power reaches a preselected level during the startup mode.

26. The system of claim 24 wherein the system further comprises means for electrically seeding the plasma-forming gas during the startup mode to further enhance formation of the plasma.

27. The system of claim 24 further comprising first modifying means connected to modify the first capacitive means during the startup mode, and second modifying means connected to modify the first capacitive means during the startup mode, so as to further enhance formation of the plasma.

28. The system of claim 27 wherein the first modifying means comprises a first switch connected to the first drain terminal, and a first shunt capacitor connected between the first switch and the first source terminal, and the second modifying means comprises a second switch connected to the second drain terminal, and a second shunt capacitor connected between the second switch and the second source terminal. wherein the first switch is closed to connect the first source capacitor to the first drain terminal during the startup mode, and opened during the operating mode, and the second switch is closed to connect the first source capacitor to the first drain terminal during the startup mode, and opened during the operating mode.

29. The system of claim 24 further comprising:

monitoring means connected for monitoring operating power of the primary voltage means, and control means operatively connected to the monitoring means so as to be responsive to the operating power level, and operatively connected to the primary voltage means and the bias voltage means to switch from the startup mode to the operating mode when the operating power reaches a preselected level during the startup mode;

modifying means connected to modify the capacitive means during the startup mode to further facilitate formation of the plasma, the modifying means comprising a switch connected to the drain terminal, and a source capacitor connected between the switch and the source terminal, wherein the switch is closed to connect the source capacitor to the drain terminal during the startup mode, and opened during the operating mode; and seeding means for electrically seeding the plasma-forming gas during the startup mode to further facilitate formation of the plasma.

30. The system of claim 18 wherein the feedback means is capacitive.

31. The system of claim 30 wherein the first feedback means comprises a first capacitive connection between the second section and the first gate terminal, and the second feedback means comprises a second capacitive connection between the first section and the second gate terminal.

32. The system of claim 31 wherein the coil has a first coil terminal and a second coil terminal, the first primary capacitance is connected between the first coil terminal and the first drain terminal, the second primary capacitance is connected between the second coil terminal and the second drain terminal, the first feedback means comprises a first capacitive connection between the second coil terminal and the first gate terminal, and the second feedback means comprises a second capacitive connection between the first coil terminal and the second gate terminal.

33. The system of claim 32 wherein:

the first feedback means comprises a first intermediate capacitor connected between the second coil terminal and a first intermediate point, a first source capacitor connected between the first intermediate point and the second source terminal, and a first connection between the first intermediate point and the first gate terminal; and the second feedback means comprises a second intermediate capacitor connected between the first coil terminal and a second intermediate point, a second source capacitor connected between the second intermediate point and the first source terminal, and a second connection between the second intermediate point and the second gate terminal.

34. The system of claim 33 wherein the first section and the second section have matched topologies, the first feedback means and the second feedback means have matched topologies, and the resonance circuit has a connection to ground potential such that the load means has an average voltage substantially equal to the ground potential.

35. The system of claim 34 in the form of a plasma generating system, wherein the load means comprises channeling means for channeling a plasma-forming gas within the coil, whereby electrical power in the oscillation loop is transferred inductively through the coil to the plasma-forming gas to effect a plasma in the channeling means.

36. The system of claim 18 wherein the feedback means is inductive.

37. The system of claim 36 wherein the first feedback means comprises a first inductive connection between the first section and the first gate terminal, and the second feedback means comprises a second inductive connection between the second section and the second gate terminal.

38. The system of claim 37 wherein the first inductive connection comprises a first transformer with a first primary side connected in series with the first capacitance between the first coil terminal and the first drain terminal, and a first secondary side connected between the first gate terminal and the first source terminal, and the second inductive connection comprises a second transformer with a second primary side connected in series with the second capacitance between the second coil terminal and the second drain terminal, and a second secondary side connected between the second gate terminal and the second source terminal.

39. The system of claim 38 the first inductive connection further comprises a first high frequency amplifier connected between the first secondary side and the first gate terminal, and the second inductive connection further comprises a second high frequency amplifier connected between the second secondary side and the second gate terminal.

40. The system of claim 39 wherein the first amplifier comprises a first transistor amplifier with a first amplifier gate and a DC bias voltage supply to the first amplifier gate, the second amplifier comprises a second transistor amplifier with a second amplifier gate and a DC bias voltage supply to the second amplifier gate, and the system further comprises a first DC blocking capacitor connected between the first secondary side and the first amplifier gate, and a second DC blocking capacitor connected between the second secondary side and the second amplifier gate.

41. The system of claim 40 wherein the first section and the second section have matched topologies, the first feedback means and the second feedback means have matched topologies, and the resonance circuit is connected to ground potential such that the load means has an average voltage substantially equal to the ground potential.

42. The system of claim 41 in the form of a plasma generating system, wherein the load means comprises channeling means for channeling a plasma-forming gas within the coil, whereby electrical power in the oscillation loop is transferred inductively through the coil to the plasma-forming gas to effect a plasma in the channeling means.

* * * * *